United States Patent
Chen

(10) Patent No.: US 7,309,636 B2
(45) Date of Patent: Dec. 18, 2007

(54) HIGH-VOLTAGE METAL-OXIDE-SEMICONDUCTOR DEVICE AND METHOD OF MANUFACTURING THE SAME

(75) Inventor: Chin-Lung Chen, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 31 days.

(21) Appl. No.: 11/163,987

(22) Filed: Nov. 7, 2005

(65) Prior Publication Data

US 2007/0111415 A1    May 17, 2007

(51) Int. Cl.
*H01L 21/336*    (2006.01)
(52) U.S. Cl. .............. 438/298; 438/218; 438/223; 438/227; 438/228; 438/294; 438/510; 438/527
(58) Field of Classification Search .......... 438/218, 438/223, 227, 228, 294, 298, 510, 527
See application file for complete search history.

(56) References Cited

U.S. PATENT DOCUMENTS

| 5,545,577 | A  | * | 8/1996 | Tada ........................ 438/232 |
| 6,350,641 | B1 | * | 2/2002 | Yang ........................ 438/227 |
| 7,214,591 | B2 | * | 5/2007 | Hsu ......................... 438/298 |
| 2006/0006461 | A1 | * | 1/2006 | Chidambaram ............. 257/341 |
| 2006/0068538 | A1 | * | 3/2006 | Ogura ....................... 438/197 |

* cited by examiner

*Primary Examiner*—Zandra V. Smith
*Assistant Examiner*—Bac H. Au
(74) *Attorney, Agent, or Firm*—Winston Hsu

(57) ABSTRACT

The present invention pertains to a high-voltage MOS device. The high-voltage MOS device includes a substrate, a first well, a first field oxide layer enclosing a drain region, a second field oxide enclosing a source region, and a third field oxide layer encompassing the first and second field layers with a device isolation region in between. A channel region is situated between the first and second field oxide layers. A gate oxide layer is provided on the channel region. A gate is stacked on the gate oxide layer. A device isolation diffusion layer is provided in the device isolation region.

8 Claims, 18 Drawing Sheets

HIGH-VOLTAGE METAL-OXIDE-SEMICONDUCTOR DEVICE AND METHOD OF MANUFACTURING THE SAME

BACKGROUND OF THE INVENTION

1. Field of the Invention

The present invention relates to high-voltage devices and, more particularly, to a semiconductor high-voltage metal-oxide-semiconductor (HVMOS) device and method of manufacturing the same.

2. Description of the Prior Art

Integrated circuits (ICs) containing both high-voltage and low-voltage devices such as high/low voltage MOS transistor devices are known in the art. For example, the low-voltage device may be used in the control circuits as the high-voltage device may be used in electrically programmable read only memory (EPROM) or the driving circuits of the liquid crystal display. Isolation structures such as field oxide layers, which increase the distance between the gate and the source/drain and further decrease the transverse electric field in the channel, are used for preventing short channel effects of the high-voltage MOS device. Thus, the high-voltage MOS transistor devices can function during high-voltage (30V~40V) operations.

Please refer to FIG. 1 to FIG. 9, wherein FIG. 1 to FIG. 7 are schematic, cross-sectional diagrams illustrating the process steps of fabricating the high-voltage MOS device according to the prior art method; FIG. 8 and FIG. 9 are plan views of the high voltage MOS device at different stages; FIG. 1 is the cross-sectional view taken along line I-I of FIG. 8; and FIG. 3 is the cross-sectional view taken along line II-II of FIG. 9.

As shown in FIG. 1 and briefly referring to FIG. 8, a semiconductor substrate 10 is provided. The semiconductor substrate 10 has thereon a P well 12. Within the P well 12, two spaced apart N wells 14 are formed. A pad oxide layer 16 is then formed over the semiconductor substrate 10. After the formation of the pad oxide layer 16, a mask pattern 20a and mask pattern 20b are formed on the pad oxide layer 16 using conventional lithography and etching processes. The mask pattern 20a defines a channel region of the high-voltage MOS device, while the mask pattern 20b defines source/drain regions of the high-voltage MOS device. The mask patterns 20a and 20b may be made of silicon nitride.

As shown in FIG. 2, a patterned photoresist layer 22 is formed on the semiconductor substrate 10. The patterned photoresist layer 22 has an opening 23 that exposes a pre-selected surface area between the mask pattern 20a and mask pattern 20b. Subsequently, an ion implantation process is carried out to implant N type ion species such as phosphorus or arsenic into the semiconductor substrate 10, thereby forming N drift regions 24 next to the mask pattern 20a. After this, the photoresist layer 22 is stripped off.

As shown in FIG. 3 and briefly referring to FIG. 9, a patterned photoresist layer 32 is formed on the semiconductor substrate 10. The patterned photoresist layer 32 has an opening 33 that exposes a strip of peripheral area in which a P type device isolation diffusion is to be formed. As can be best seen in FIG. 9, the strip of opening 33 bends inward and connects to both ends of the mask pattern 20a that defines the channel region of the high-voltage MOS device. Subsequently, using the patterned photoresist layer 32 as an ion implantation mask, P type ion species such as boron is implanted into the semiconductor substrate 10 through the opening 33, thereby forming P type device isolation diffusion region 36. Thereafter, the patterned photoresist layer 32 is removed. Typically, a thermal drive-in process is performed to activate the dopants previously implanted into the semiconductor substrate 10.

As shown in FIG. 4, a thermal oxidation process is carried out to form field oxide layers 42 and 44 on the surface areas of the semiconductor substrate 10 that are not covered with the mask patterns 20a and 20b. The field oxide layer 42 is formed between the mask pattern 20a and mask pattern 20b, and is contiguous with the underlying N drift region 24. The field oxide layer 44 is formed on the other side of the mask pattern 20b opposite to the field oxide layer 42. The P type device isolation diffusion region 36 is situated directly underneath the field oxide layer 44. In accordance with the prior art method, the P type device isolation diffusion region 36 in the high-voltage device area, which function as a channel stop, are implanted into the substrate 10 prior to the formation of field oxide layers 42 and 44. This is disadvantageous because the dopants in the P type device isolation diffusion region 36 laterally diffuse when taking subsequent high-temperature thermal processes.

As shown in FIG. 5, the mask patterns 20a and 20b are removed. The pad oxide layer 16 is then etched away. As shown in FIG. 6, an oxidation process is performed to grow a gate oxide layer 56 on the exposed semiconductor substrate 10. After the growth of the gate oxide layer 56, a doped polysilicon gate 58 is formed on the gate oxide layer 56 directly above the channel region between the N drift regions 24. The formation of the doped polysilicon gate 58 is known in the art. For example, a chemical vapor deposition process is carried out to deposit a layer of doped polysilicon over the semiconductor substrate 10, followed by lithographic process and dry etching process to pattern the gate.

As shown in FIG. 7, a patterned photoresist layer 72 is formed on the semiconductor substrate 10. The patterned photoresist layer 72 has an opening 73 that exposes the source/drain regions of the high-voltage MOS device. An ion implantation process is performed to implant N type ion species such as phosphorus or arsenic into the N wells 14, thereby forming $N^+$ source/drain region 74. Finally, the photoresist layer 72 is removed.

The above-described prior art method has several drawbacks. First, according to the prior art method, the photoresist layer 32 and an additional photo mask for defining the strip opening 33 are necessary for the implantation of the P type device isolation region 36. Therefore, the cost is high. Second, the P type device isolation region 36 is formed prior to the formation of the field oxide layers 42 and 44, resulting in lateral diffusion of the P type device isolation region 36. The lateral diffusion of the P type device isolation region 36 changes the junction profile of the device isolation diffusion and decreases the doping concentration of the device isolation region 36, thus prohibits the use of poly field device or even M-1 field device at circuit design stage. Further, the lateral diffusion also hinders the shrinkage of the high-voltage MOS device.

SUMMARY OF THE INVENTION

It is the primary object of the present invention to provide an improved semiconductor high-voltage metal-oxide-semiconductor (HVMOS) device and method of manufacturing the same in order to solve the above-described prior art problems.

According to the claimed invention, a method of manufacturing a high-voltage metal-oxide-semiconductor (MOS) device is provided. The method includes the following steps:

(1) providing a semiconductor substrate having thereon a first ion well with a first conductivity type;

(2) forming a pad oxide layer on the semiconductor substrate;

(3) forming a silicon nitride layer on the pad oxide layer;

(4) etching away portions of the silicon nitride layer to form an active area mask pattern that covers a channel region, a drain region, a source region and an device isolation region of the high-voltage MOS device;

(5) performing an oxidation process to grow a first field oxide layer, a second field oxide layer and a third field oxide layer spaced-apart from one another on surface areas of the semiconductor substrate that are not covered by the active area mask pattern, wherein the first field oxide layer encloses the drain region, while the second field oxide layer encloses the source region;

(6) removing the active area mask pattern;

(7) removing the pad oxide layer;

(8) growing a gate oxide layer on the channel region;

(9) forming a gate on the gate oxide layer;

(10) performing a first ion implantation process to form a drain doping region in the drain region and a source doping region in the source region, wherein the drain doping region and the source doping region both have a second conductivity type; and

(11) performing a second ion implantation process to form a device isolation diffusion region with the first conductivity type in the device isolation region.

From one aspect of this invention, the present invention discloses a high-voltage metal-oxide-semiconductor (MOS) device. The high-voltage MOS device comprises a semiconductor substrate; a first ion well of first conductivity type formed in the semiconductor substrate; a first field oxide layer formed on the first ion well and enclosing a drain region of the high-voltage MOS device; a drain doping region with a second conductivity type being formed in the semiconductor substrate within the drain region; a second field oxide layer formed on the first ion well and enclosing a source region of the high-voltage MOS device, wherein a channel region is situated between the first and second field oxide layers; a source doping region with the second conductivity type being formed in the semiconductor substrate within the source region; a gate oxide layer provided on the channel region; a gate provided on the gate oxide layer; a third field oxide layer enclosing the first field oxide layer and the second field oxide layer space-apart from one another with a device isolation region in between; and a device isolation diffusion region of the first conductivity type formed in the first ion well within the device isolation region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 8 and FIG. 9 are plan views of the high voltage MOS device at different stages; wherein FIG. 1 is the cross-sectional view taken along line I-I of FIG. 8; and FIG. 3 is the cross-sectional view taken along line II-II of FIG. 9;

FIG. 17 is a plan view of the high voltage MOS device after the definition of active areas with silicon nitride mask; wherein FIG. 10 is the cross-sectional view taken along line III-III of FIG. 17.

DETAILED DESCRIPTION

The present invention pertains to an improved method for making an integrated circuit having high-voltage devices. It is noteworthy that the present invention is suited for making high-voltage MOS devices that have gate and drain terminals operated at a high voltage of above 40V. The present invention method is specifically suited for the manufacture of high voltage device having field oxide under gate structure and drift layers under the field oxide.

Figure 10:
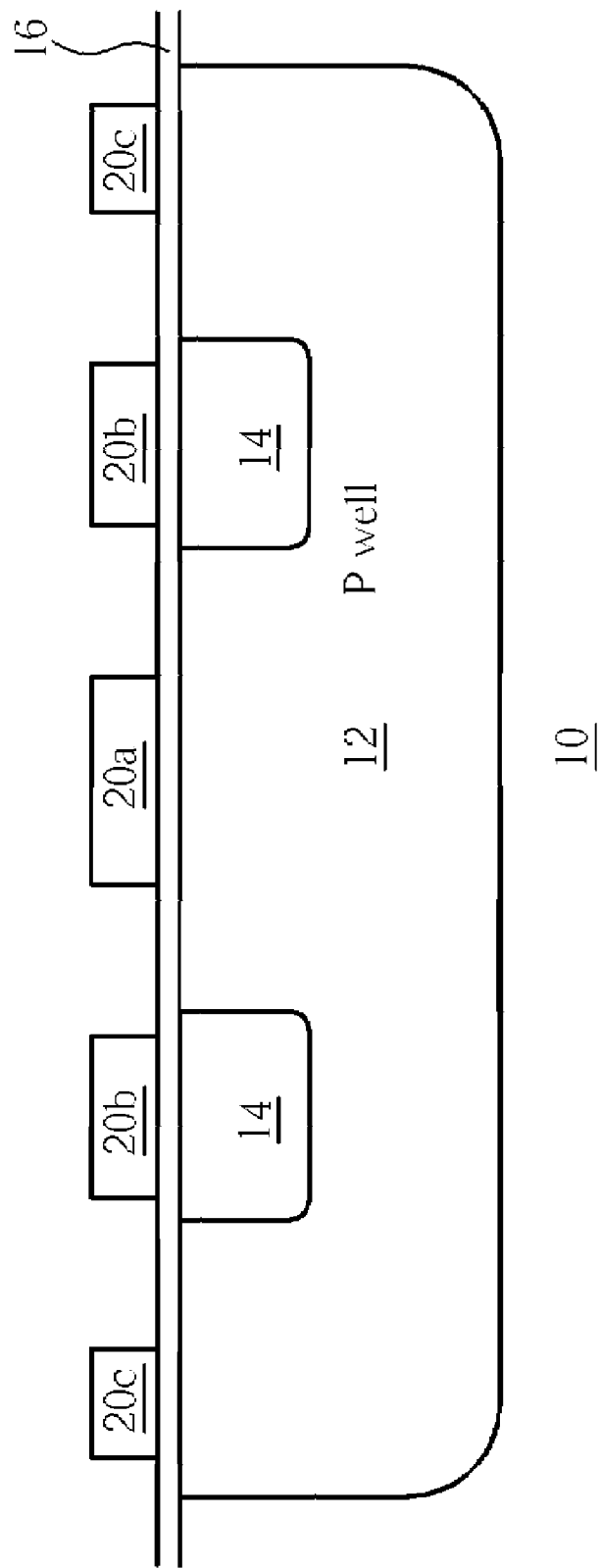
FIG. 10 to FIG. 16 are schematic, cross-sectional diagrams illustrating the process steps of fabricating the high-voltage MOS device according to a preferred embodiment of this invention.
Figure 11:
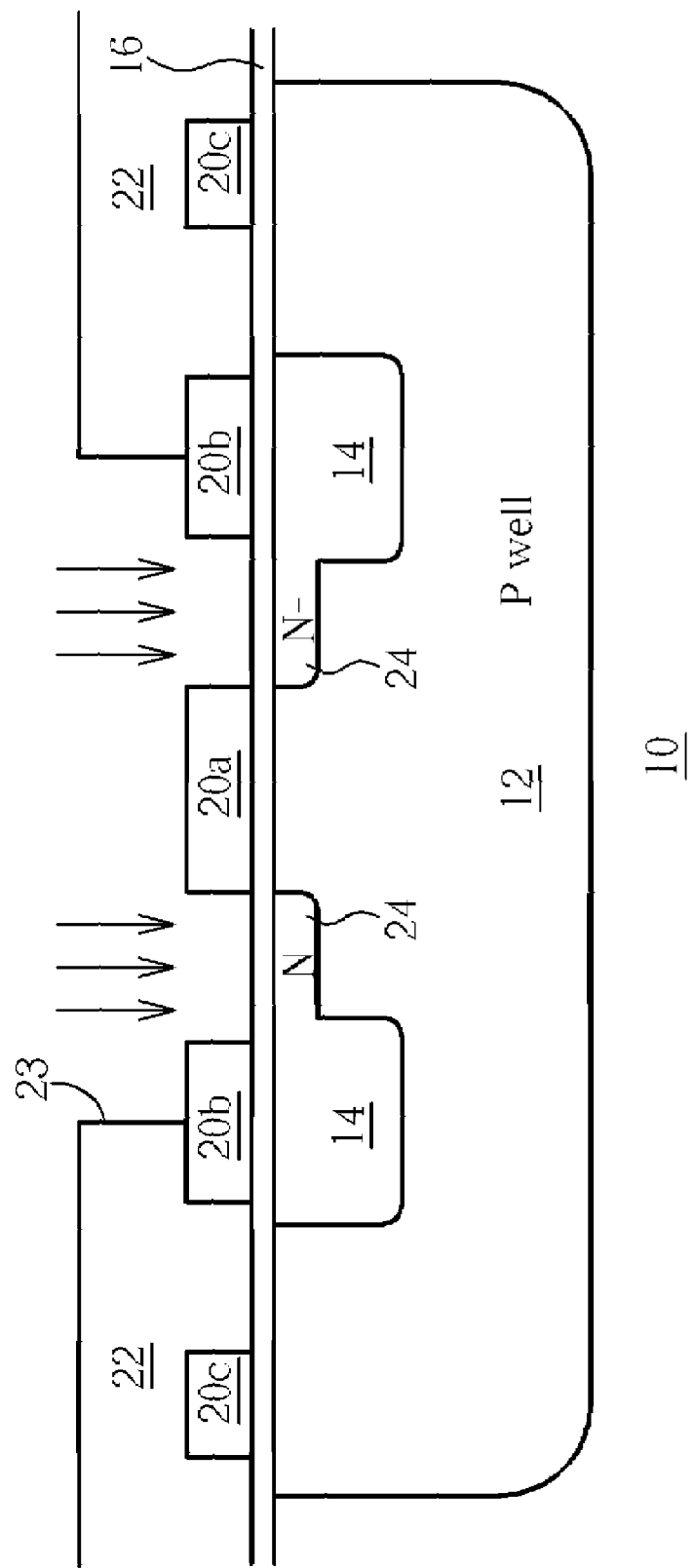
Figure 15:
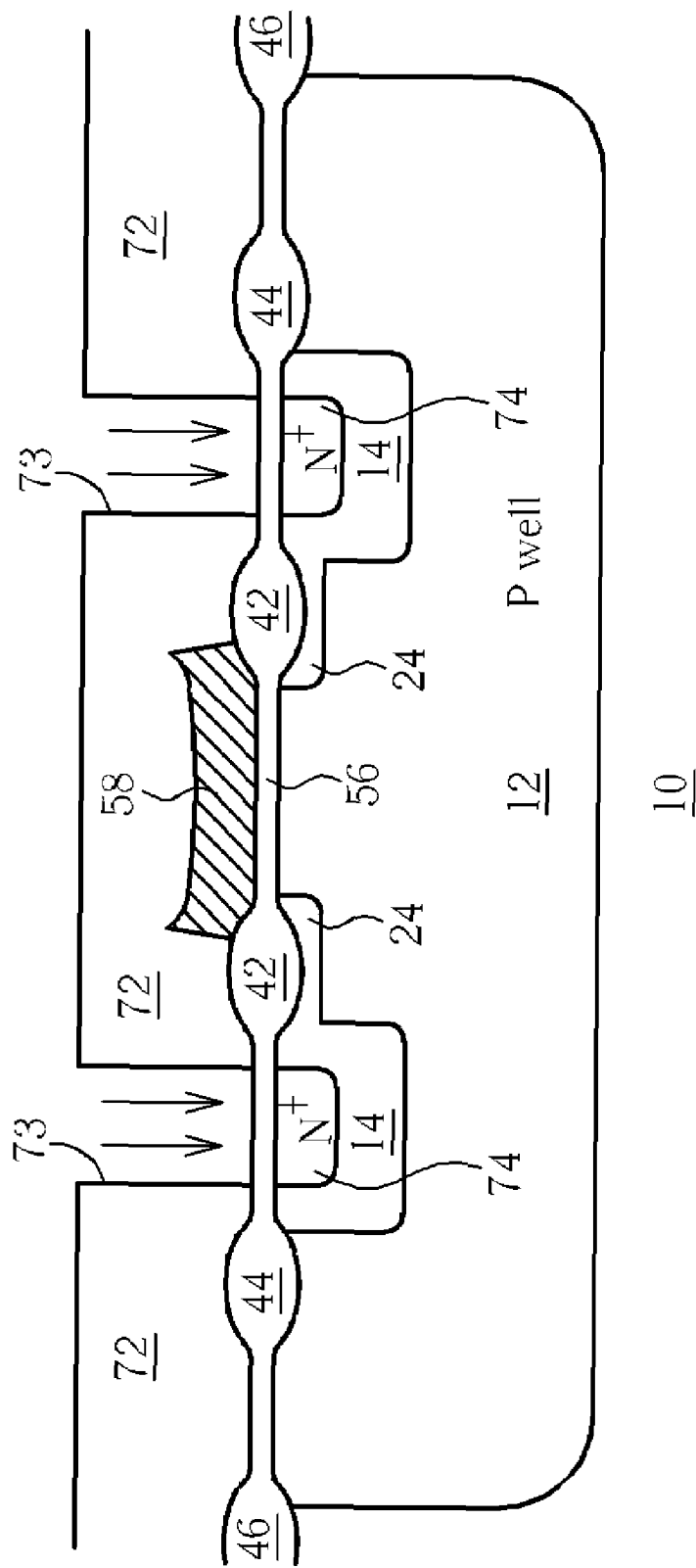
Figure 16:
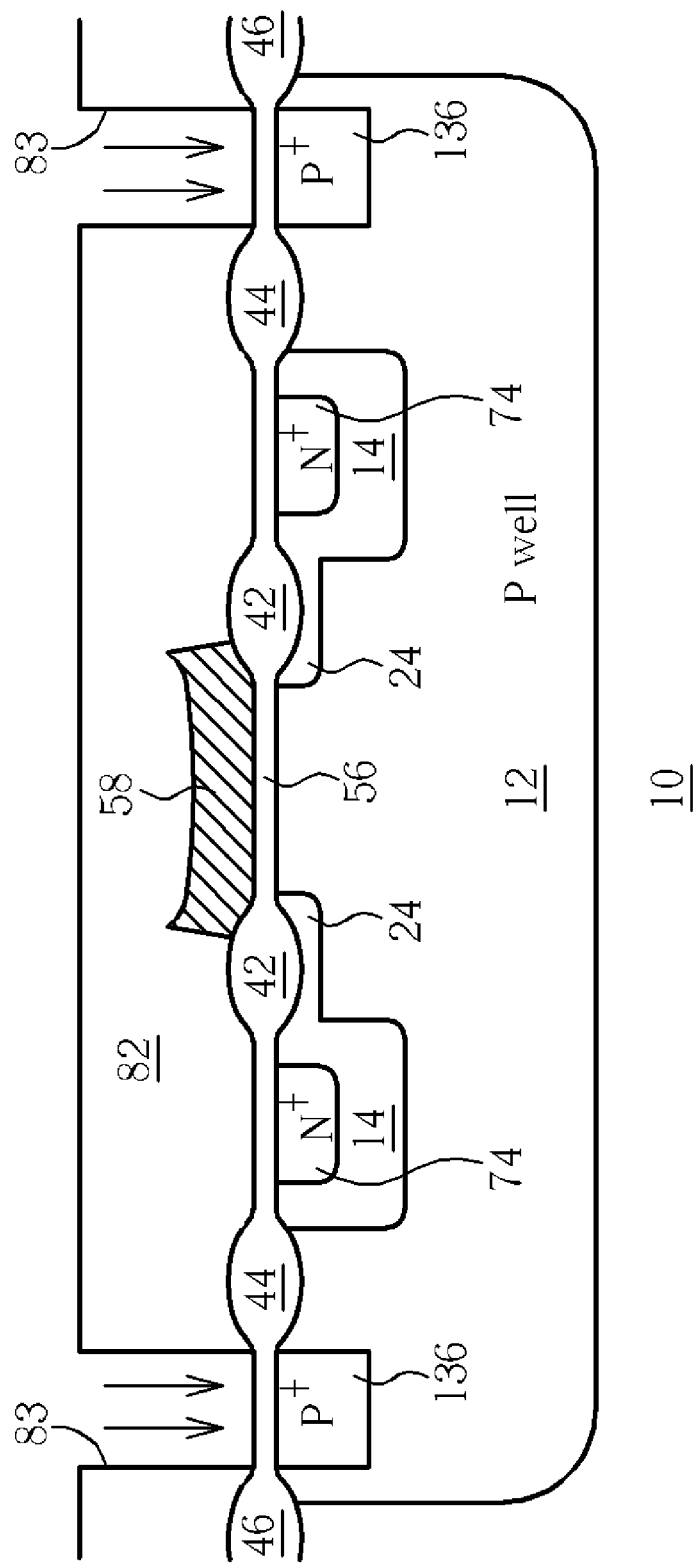
Figure 17:
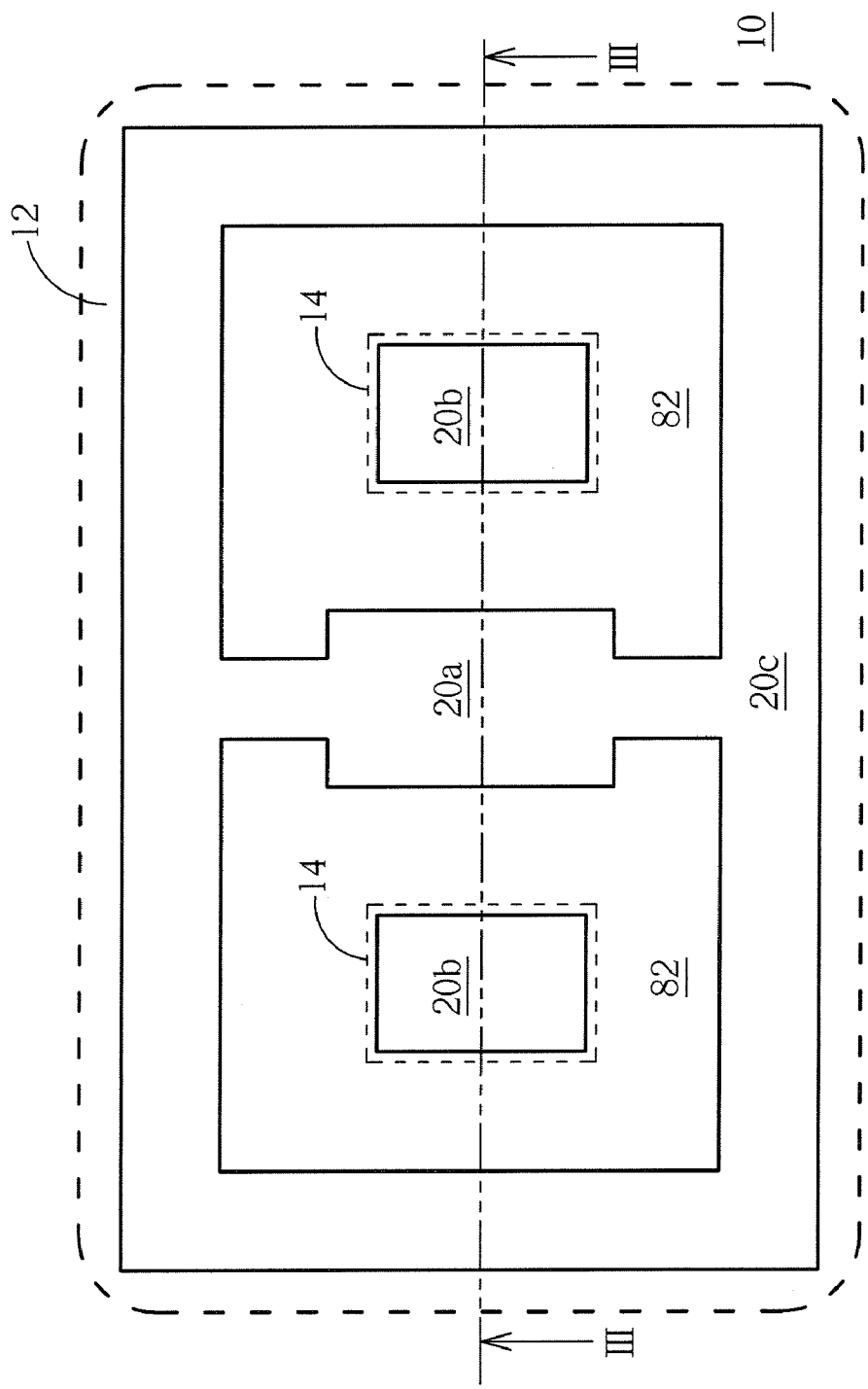

Please now refer to FIG. 10 to FIG. 17 wherein like numerals designate similar layers, regions or elements. FIG. 10 to FIG. 16 are schematic, cross-sectional diagrams illustrating the process steps of fabricating the high-voltage NMOS device according to a preferred embodiment of this invention. FIG. 17 is a plan view of the high-voltage NMOS device after the definition of active areas with silicon nitride mask. FIG. 10 is the cross-sectional view taken along line III-III of FIG. 17. Although only the NMOS device is proposed in the embodiments, it is understood that the present invention is also suited for the PMOS devices by properly modifying polarities of the diffusion regions of the device.

As shown in FIG. 10, a semiconductor substrate 10 is provided. A P well 12 is formed on the semiconductor substrate 10. Within the P well 12, two spaced apart N wells 14 are formed. The two spaced-apart N wells 14 act as N grade wells for the source/drain regions of the high-voltage MOS device. A pad oxide layer 16 is then formed over the semiconductor substrate 10.

After the formation of the pad oxide layer 16, mask pattern 20a, mask pattern 20b and mask pattern 20c are formed on the pad oxide layer 16 using conventional lithography and etching processes. The two ends of the mask pattern 20a are connected with the mask pattern 20c. The mask pattern 20a defines a channel region of the high-voltage MOS device, while the mask pattern 20b defines source/drain regions of the high-voltage MOS device. The mask pattern 20c defines a P channel stop region or device isolation diffusion region to be formed in the semiconductor substrate 10. The mask patterns 20a, 20b and 20c may be made of silicon nitride.

It is one salient feature of the present invention that the surface area of the semiconductor substrate 10 corresponding to the P channel stop region or device isolation diffusion region to be formed in the subsequent processes is masked by the mask pattern 20c, simultaneously with the definition of the active regions of the high-voltage MOS device.

Accordingly, no field oxide will be formed in the masked surface area corresponding to the P channel stop region or device isolation diffusion region to be formed in the semiconductor substrate 10 during the subsequent field oxidation process.

Figure 1:
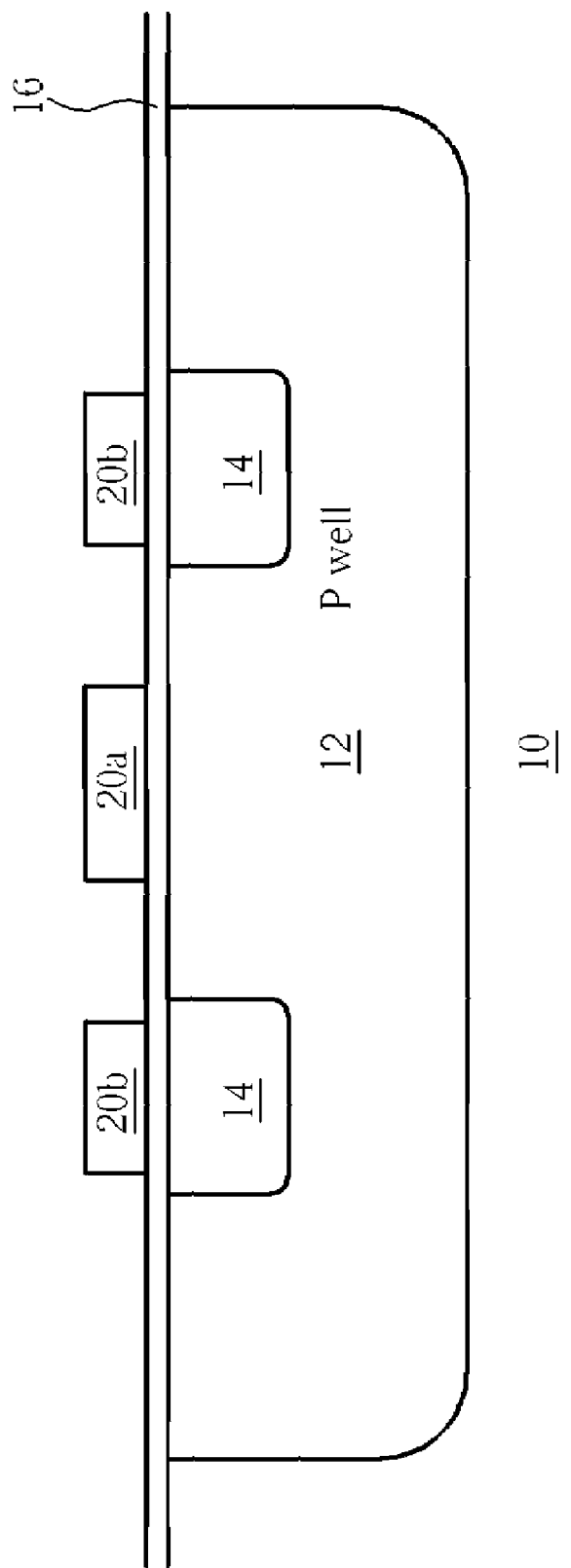
FIG. 1 to FIG. 7 are schematic, cross-sectional diagrams illustrating the process steps of fabricating the high-voltage MOS device according to the prior art method.
Figure 2:
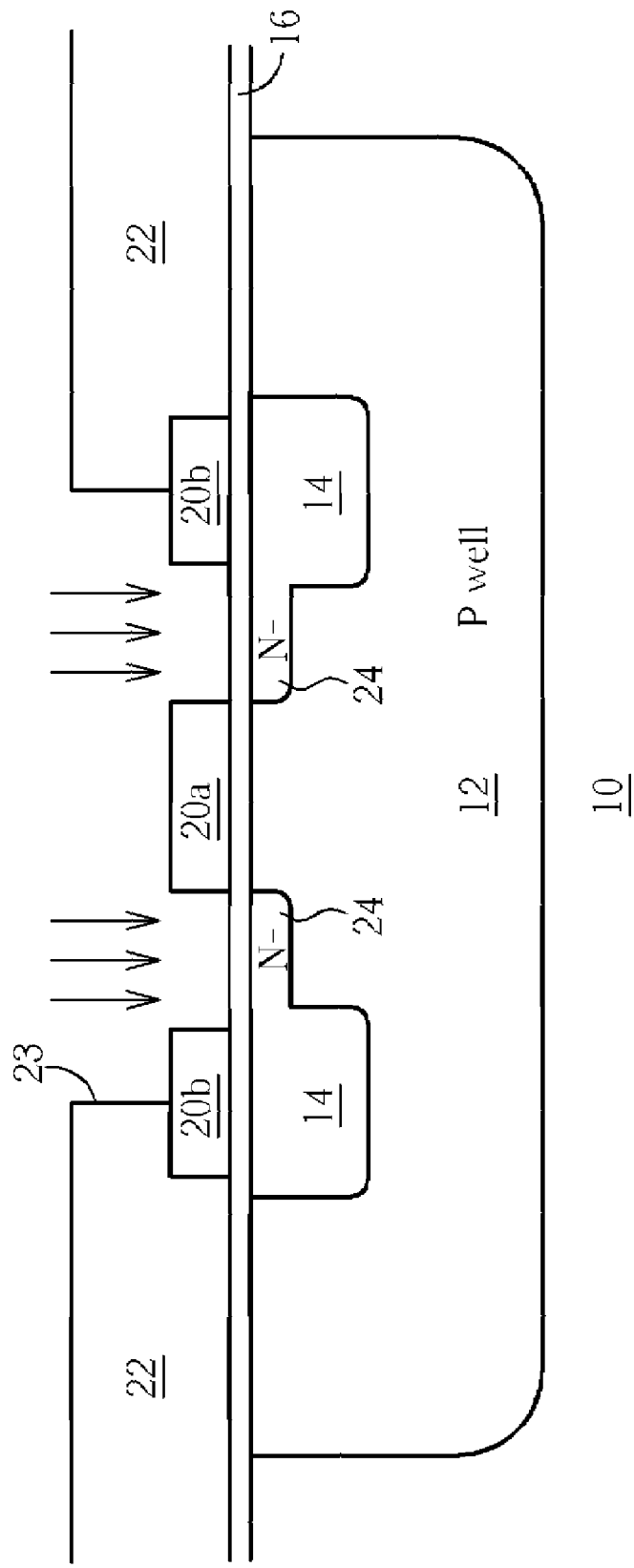
Figure 3:
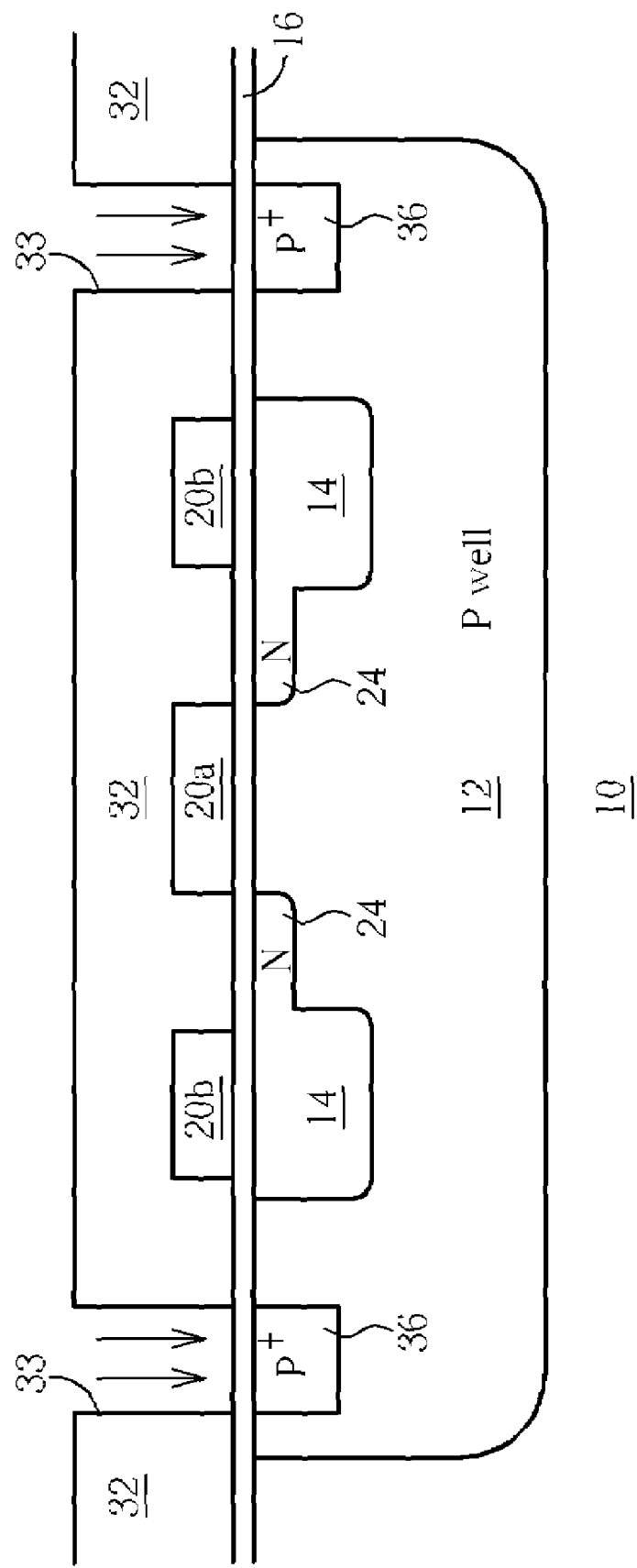
Figure 4:
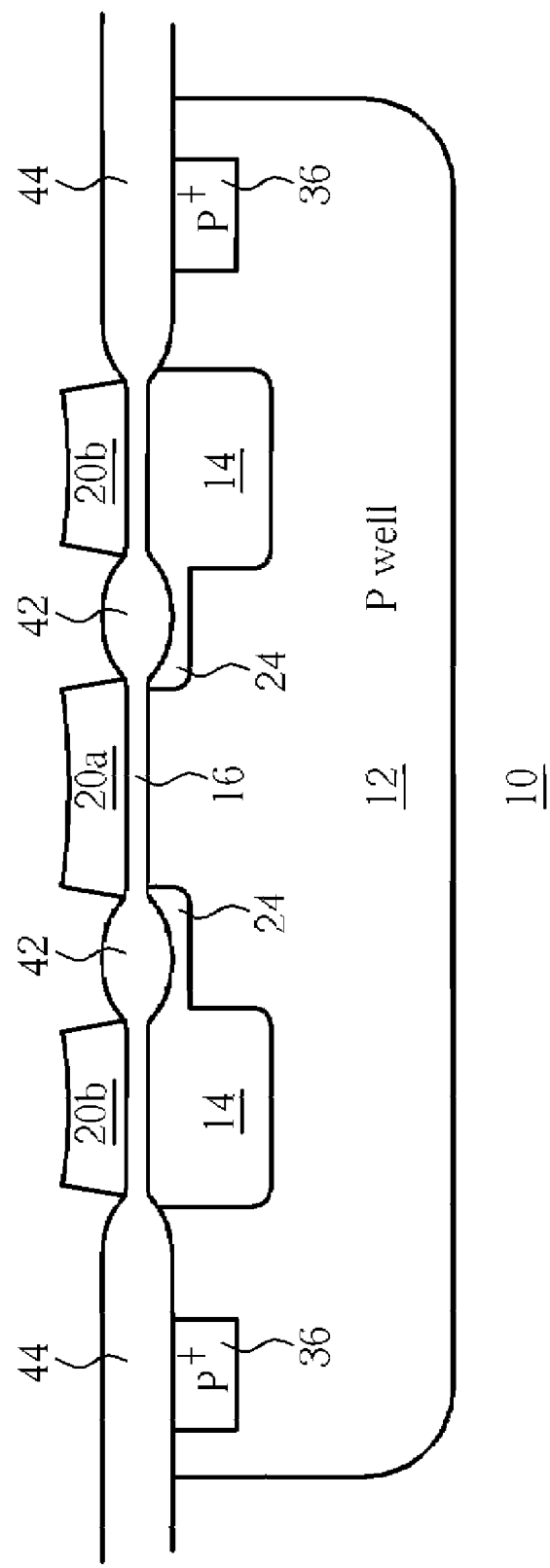
Figure 5:
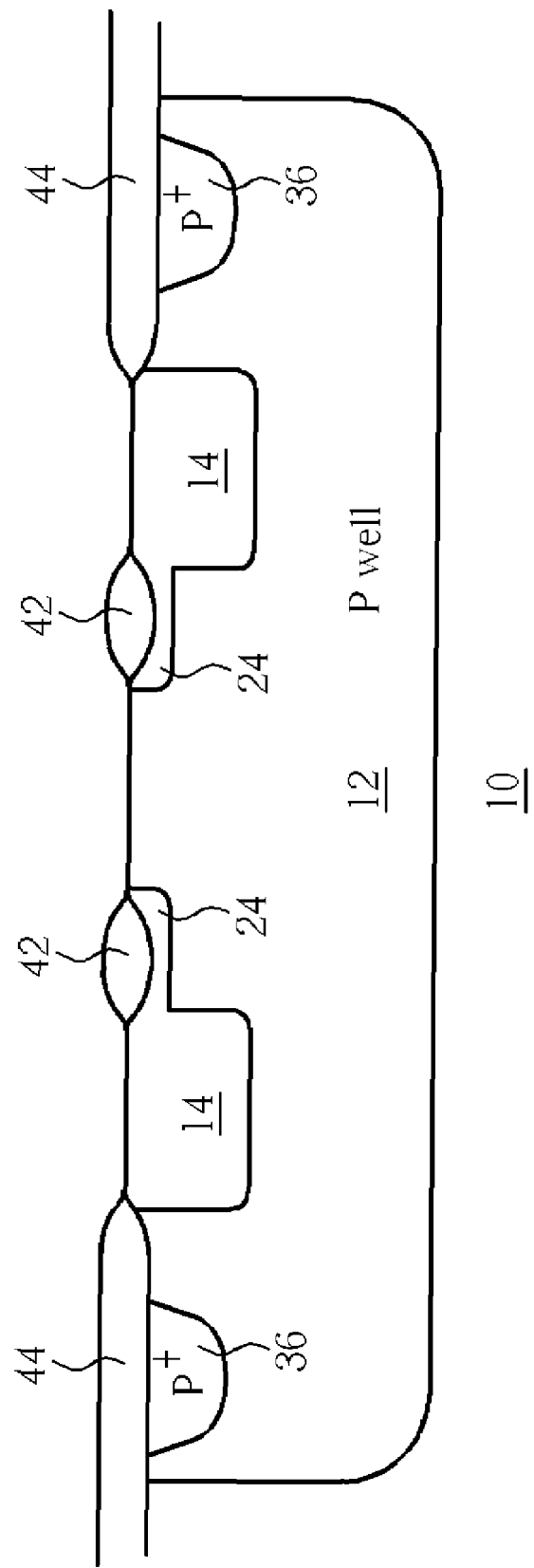
Figure 6:
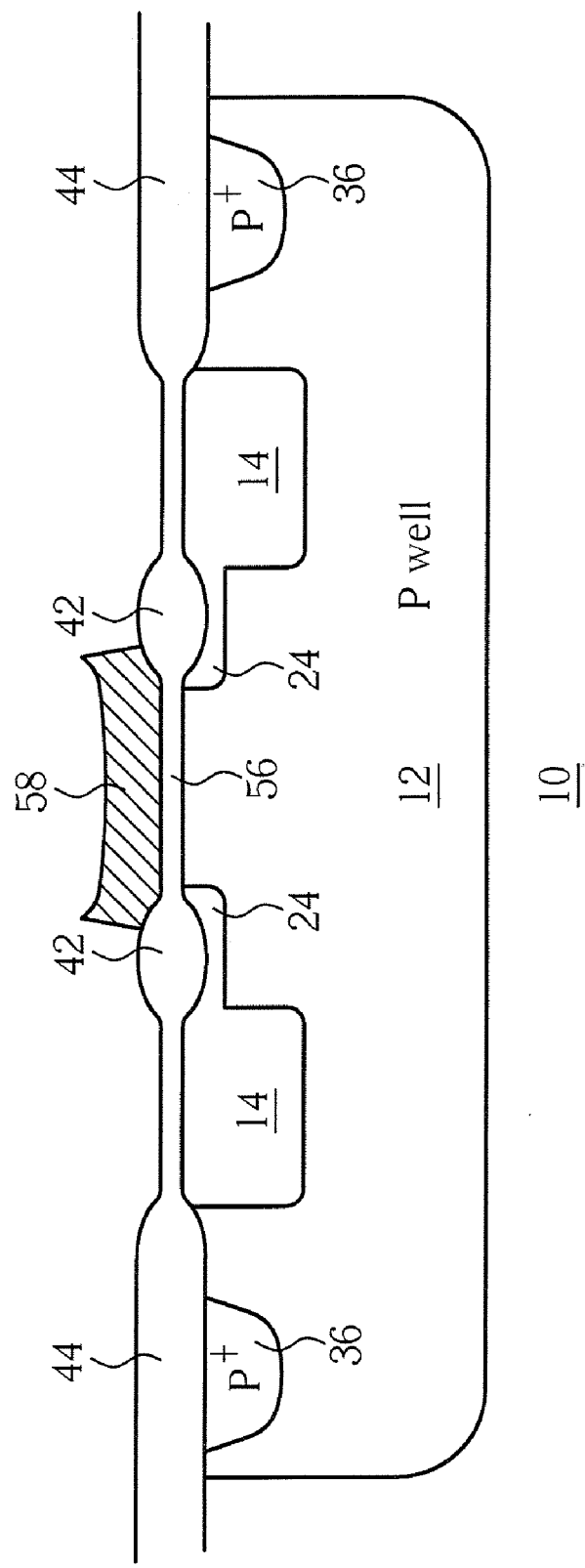
Figure 7:
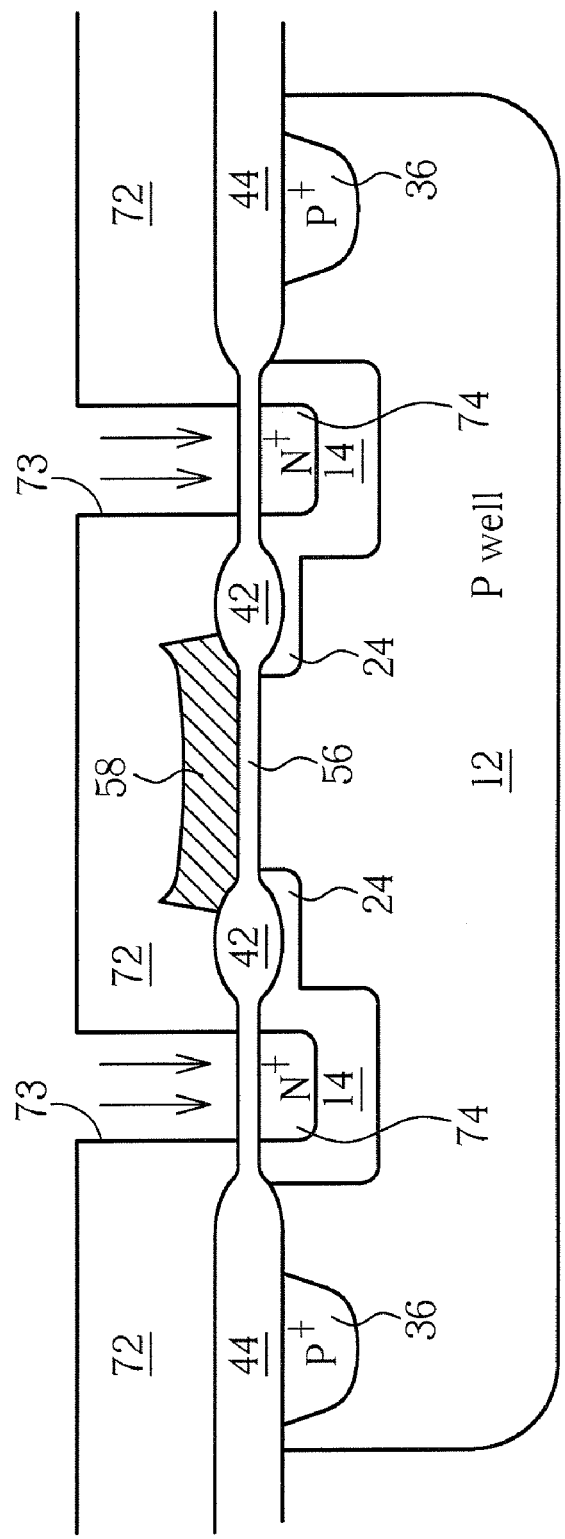
Figure 8:
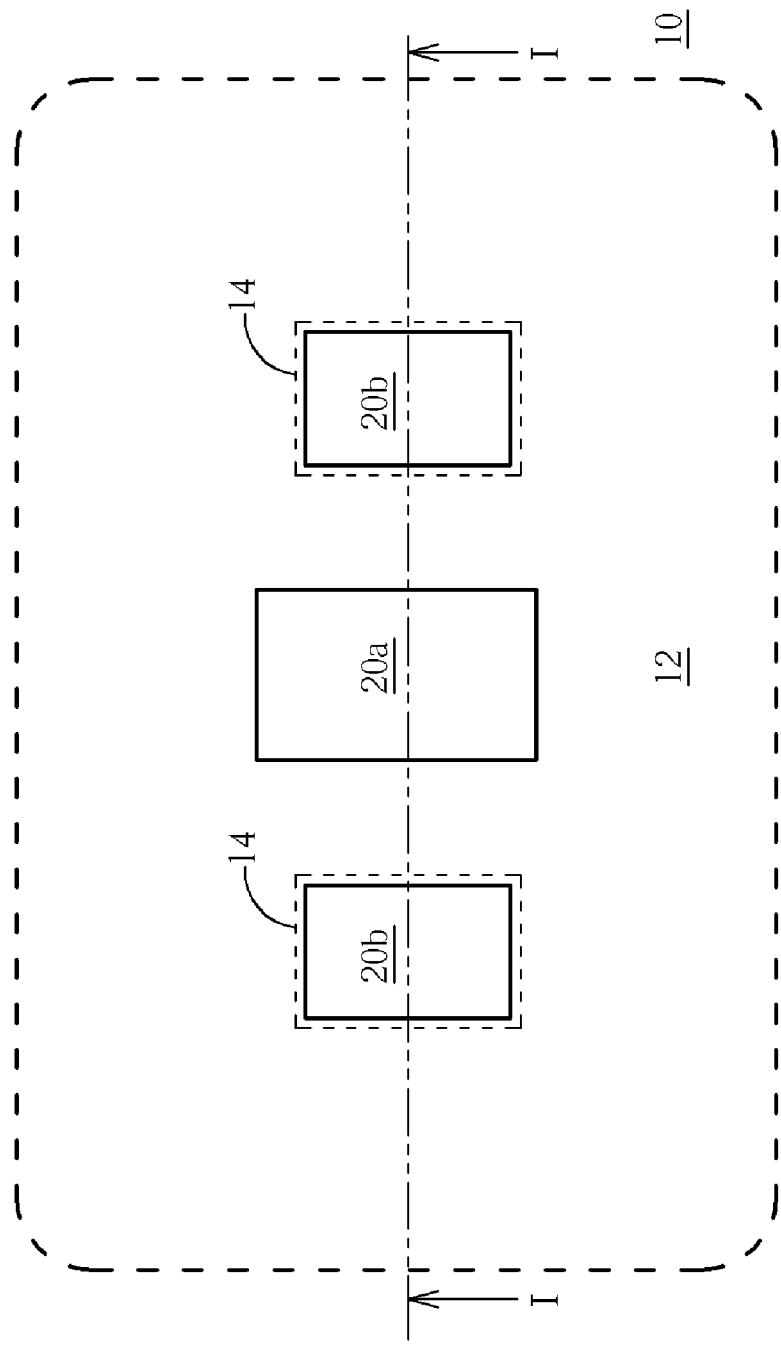
Figure 9:
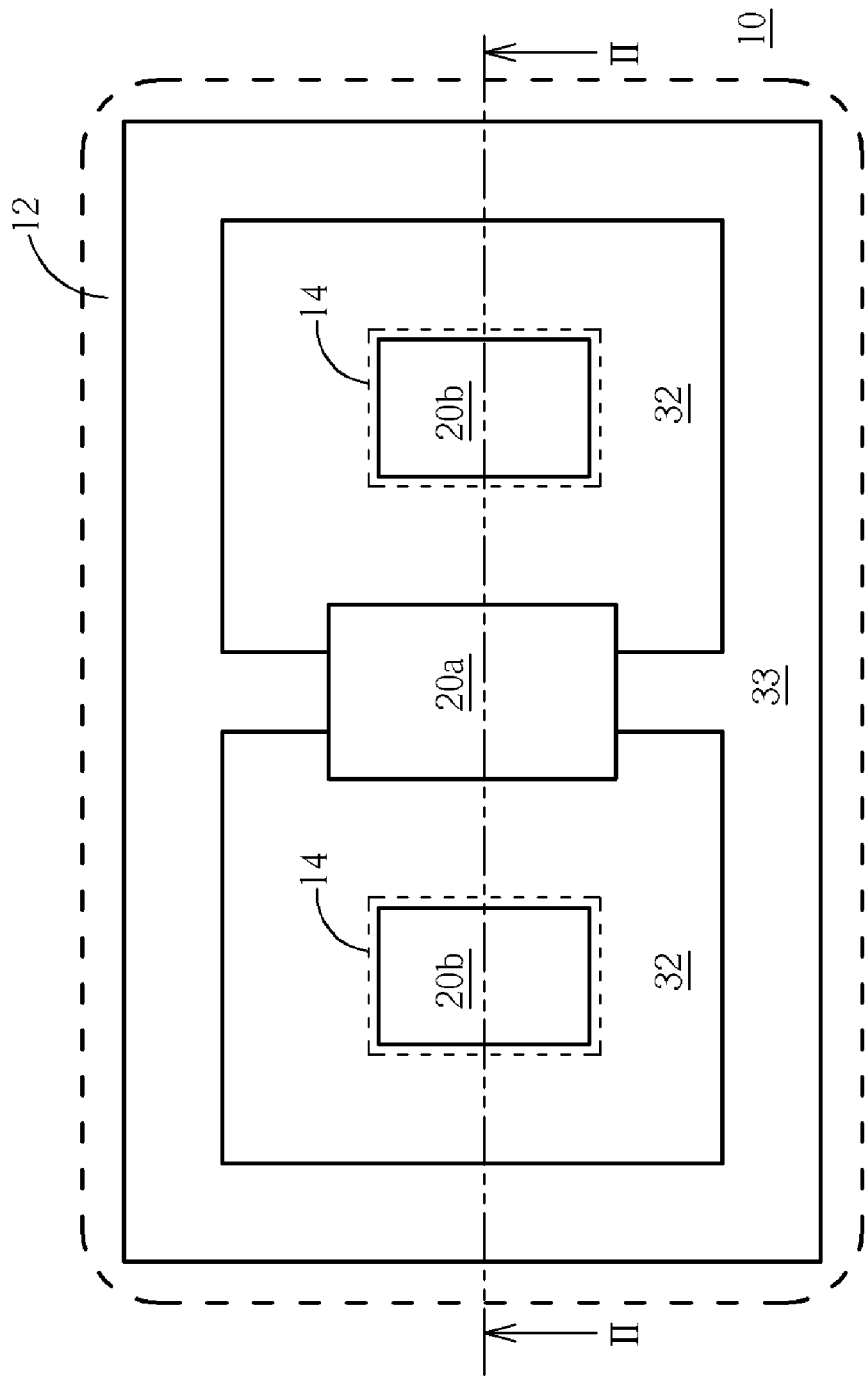

As shown in FIG. 1, a patterned photoresist layer 22 is formed on the semiconductor substrate 10. Likewise, the patterned photoresist layer 22 has an opening 23 that exposes a pre-selected surface area between the mask pattern 20a and mask pattern 20b. Subsequently, an ion implantation process is carried out to implant N type ion species such as phosphorus or arsenic into the semiconductor substrate 10, thereby forming N drift regions 24 next to the mask pattern 20a. After this, the photoresist layer 22 is stripped off. A thermal drive-in process is then performed to activate the dopants previously implanted into the semiconductor substrate 10.

Figure 12:
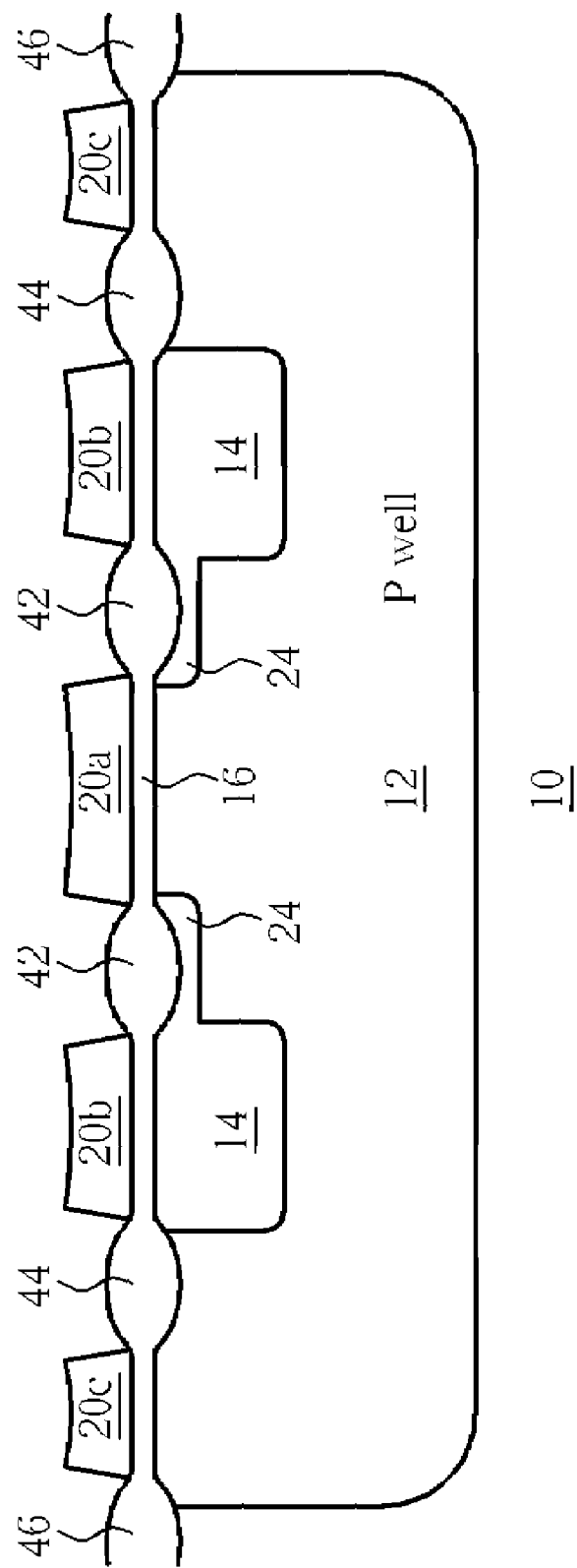

As shown in FIG. 12, a thermal oxidation process is carried out to form field oxide layers 42, 44 and 46 on the surface areas of the semiconductor substrate 10 that are not covered with the mask patterns 20a, 20b and 20c. According to the cross-section of FIG. 12, the field oxide layer 42 is formed between the mask pattern 20a and mask pattern 20b, and is contiguous with the underlying N drift region 24. The field oxide layer 44 is formed between the mask pattern 20b and mask pattern 20c. The field oxide layer 46 is formed on the other side of the mask pattern 20c opposite to the field oxide layer 44. The field oxide layers 42, 44 and 46 have a thickness of several thousand angstroms, for example, 3000-6000 angstroms, but not limited thereto. It is in the course of nature that bird's beak structures are formed under the edges of the mask patterns 20a, 20b and 20c.

As previously mentioned, in accordance with the prior art method, the P type device isolation diffusion region in the high-voltage device area are implanted into the substrate 10 prior to the formation of field oxide layers. This is disadvantageous because the dopants in the P type device isolation diffusion region laterally diffuse when taking subsequent high-temperature thermal processes. Compared to the prior art, it is an advantage of the present invention that the device isolation diffusion is implanted into the semiconductor substrate after the formation of the field oxide layers.

Figure 13:
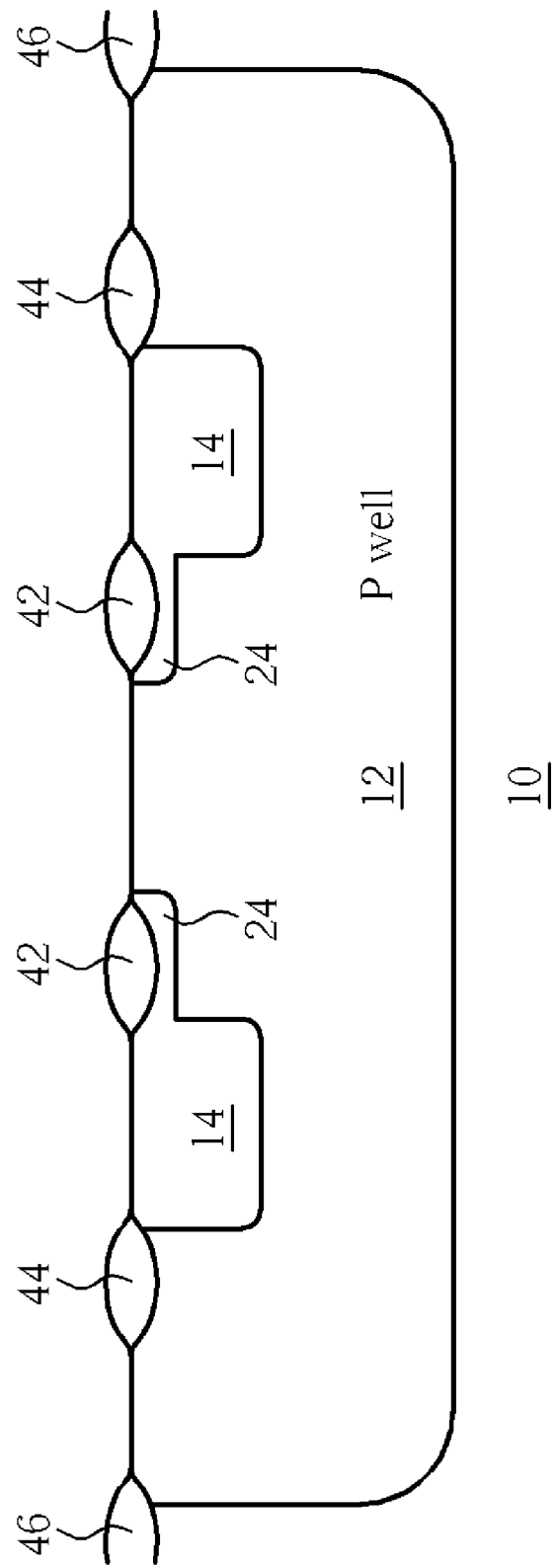

As shown in FIG. 13, the mask patterns 20a, 20b and 20c are removed. The pad oxide layer 16 is then etched away. The removal of the silicon nitride mask patterns 20a, 20b and 20c may involve the use of wet etching processes such as heated phosphoric acid solution. The pad oxide layer 16 may be etched away by using diluted hydrofluoric acid solution.

Figure 14:
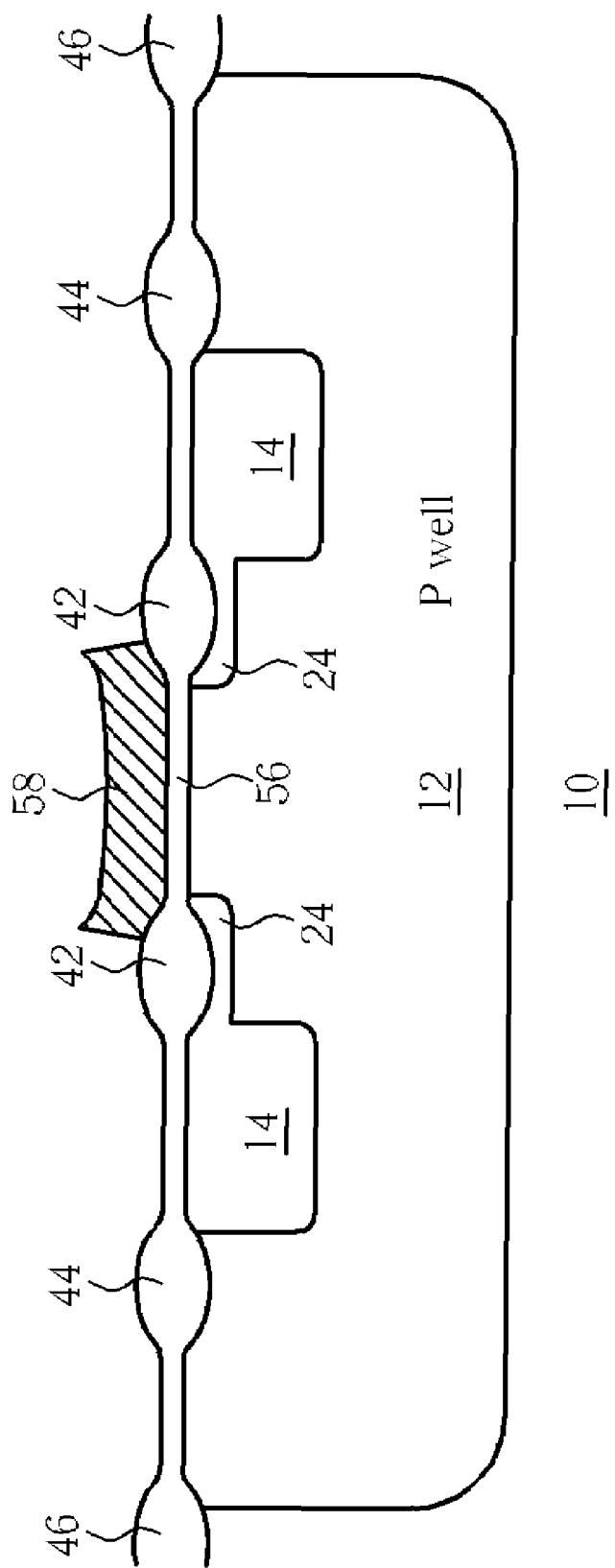

As shown in FIG. 14, an oxidation process is performed to grow a gate oxide layer 56 on the exposed semiconductor substrate 10. Depending on the operation voltage of the high-voltage MOS device, the thickness of the gate oxide layer 56 may ranges between 300 and 900 angstroms. After the growth of the gate oxide layer 56, a doped polysilicon gate 58 is formed on the gate oxide layer 56 directly above the channel region between the N drift regions 24. The formation of the doped polysilicon gate 58 is known in the art. For example, a chemical vapor deposition process is carried out to deposit a layer of doped polysilicon over the semiconductor substrate 10, followed by lithographic process and dry etching process to pattern the gate.

As shown in FIG. 15, a patterned photoresist layer 72 is formed on the semiconductor substrate 10. The patterned photoresist layer 72 has an opening 73 that exposes the source/drain regions of the high-voltage MOS device. An ion implantation process is performed to implant N type ion species such as phosphorus or arsenic into the N wells 14, thereby forming N$^+$ source/drain region 74. Finally, the photoresist layer 72 is removed.

As shown in FIG. 16, a patterned photoresist layer 82 is formed on the semiconductor substrate 10. The patterned photoresist layer 82 has an opening 83 that exposes a strip of peripheral area (equivalent to the mask pattern 20c) through which P type device isolation diffusion is to be formed in the semiconductor substrate 10. It is noteworthy that the patterned photoresist layer 82 also defines the source/drain regions of the high-voltage PMOS devices (not shown). Subsequently, using the patterned photoresist layer 82 as an ion implantation mask, P type ion species such as boron is implanted into the semiconductor substrate 10 through the opening 83, thereby forming P type device isolation diffusion region 136, simultaneously with the implantation of the source/drain regions of the high-voltage PMOS devices. Thereafter, the patterned photoresist layer 82 is removed.

The present invention is characterized in that the photoresist layer 82 used to define the source/drain regions of the high-voltage PMOS devices is also used to define the P type device isolation diffusion region 136 of the high-voltage NMOS device. Consequently, the doping concentration of the source/drain regions of the high-voltage PMOS devices is approximately equal to the doping concentration of the P type device isolation diffusion region 136, which is normally about 1E15-2E15 atoms/cm$^3$ and is one order in magnitude higher than that of the prior art method.

Figure 18:
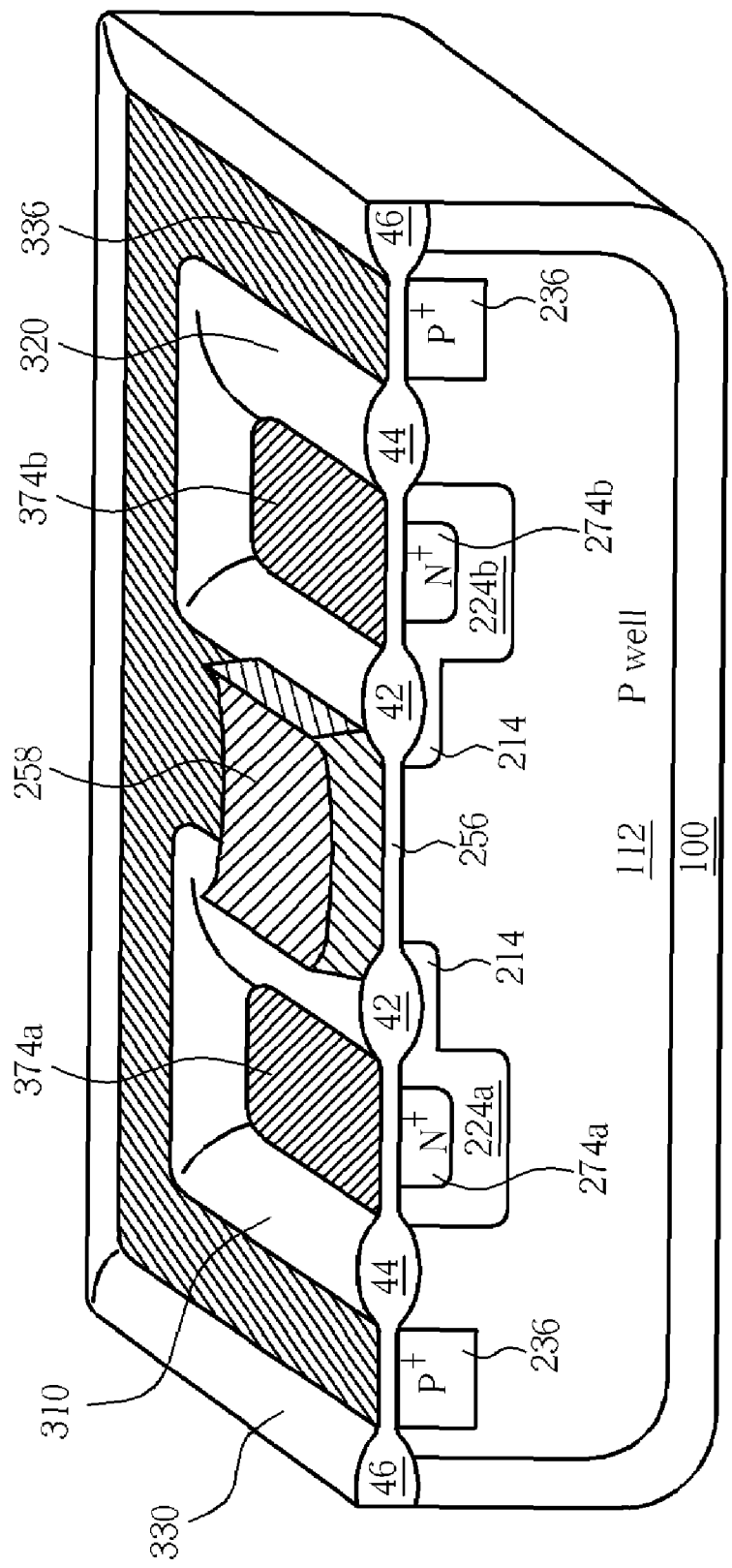
FIG. 18 illustrates a perspective cross-sectional view of the high-voltage NMOS device in accordance with the present invention.

Please refer to FIG. 18. FIG. 18 illustrates a perspective cross-sectional view of the high-voltage NMOS device in accordance with the present invention. The present invention high-voltage NMOS device comprises a semiconductor substrate 100 having thereon a P well 112. The present invention high-voltage NMOS device further comprises a first field oxide layer 310, a second field oxide layer 320 and a third field oxide layer 330 spaced apart from one another. A channel region of the high-voltage NMOS device is situated between the first field oxide layer 310 and the second field oxide layer 320.

The first field oxide layer 310 encloses a drain region 374a of the high-voltage NMOS device. An N type heavily doped drain region 274a is implanted into the semiconductor substrate 10 within the drain region 374a. An N grade ion well 224a encompasses the N type heavily doped drain region 274a.

The second field oxide layer 320 encloses a source region 374b of the high-voltage NMOS device. An N type heavily doped drain region 274b is implanted into the semiconductor substrate 10 within the drain region 374b. An N grade ion well 224b encompasses the N type heavily doped drain region 274b. A gate oxide layer 256 is formed on the aforesaid channel region. A gate 258 is staked on the gate oxide layer 256.

The third field oxide layer 330 encompasses the first field oxide layer 310 and the second field oxide layer 320 with a device isolation region 336 in between. Through the device isolation region 336, P type heavily doped device isolation diffusion 236 is implanted into the P well 112 of the semiconductor substrate 100. Between the aforesaid channel region and the N grade ion well, N drift diffusion 214 is provided.

To sum up, it is the major feature of the present invention that the device isolation diffusion region is masked simultaneously with the definition of the active areas including channel region and source/drain region of the high-voltage MOS device. There is no field oxide layer formed directly above the device isolation diffusion. It is advantageous to use the present invention method because the ion implantation is carried out after the field oxidation process, thereby preventing lateral diffusion of the device isolation diffusion. The present invention provides flexibility to circuit design because the use of poly field device and M-1 field device are allowed. Further, it is advantageous to use the present invention method because the pattern of the device isolation diffusion of the high-voltage NMOS device is defined by using the mask that also defines the source/drain regions of the high-voltage PMOS devices. Therefore, the process steps are simplified and manufacture cost is reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a high-voltage metal-oxide-semiconductor (MOS) device, comprising:
    providing a semiconductor substrate having thereon a first ion well with a first conductivity type;
    forming a pad oxide layer on the semiconductor substrate;
    forming a silicon nitride layer on the pad oxide layer;
    etching away portions of the silicon nitride layer to form an active area mask pattern that covers a channel region, a drain region, a source region and a device isolation region of the high-voltage MOS device;
    performing an oxidation process to grow a first field oxide layer, a second field oxide layer and a third field oxide layer spaced-apart from one another on surface areas of the semiconductor substrate that are not covered by the active area mask pattern, wherein the first field oxide layer encloses the drain region, while the second field oxide layer encloses the source region;
    removing the active area mask pattern;
    removing the pad oxide layer;
    growing a gate oxide layer on the channel region;
    forming a gate on the gate oxide layer;
    performing a first ion implantation process to form a drain doping region in the drain region and a source doping region in the source region, wherein the drain doping region and the source doping region both have a second conductivity type; and
    performing a second ion implantation process to form a device isolation diffusion region with the first conductivity type in the device isolation region.

2. The method according to claim 1 wherein the channel region is connected to the device isolation region.

3. The method according to claim 1 wherein the channel region is situated between the first field oxide layer and the second field oxide layer.

4. The method according to claim 1 wherein the device isolation region is situated between the third field oxide layer and the first/second field oxide layers.

5. The method according to claim 1 wherein the first conductivity is P type, and the second conductivity type is N type.

6. The method according to claim 1 wherein the first conductivity is N type, and the second conductivity type is P type.

7. The method according to claim 1 wherein the gate is a doped polysilicon gate.

8. The method according to claim 1 wherein the gate oxide layer has a thickness of about 300-900 angstroms.

* * * * *